(12) United States Patent
Ignjatovic et al.

(10) Patent No.: US 6,707,409 B1
(45) Date of Patent: Mar. 16, 2004

(54) SIGMA-DELTA ANALOG TO DIGITAL CONVERTER ARCHITECTURE BASED UPON MODULATOR DESIGN EMPLOYING MIRRORED INTEGRATOR

(75) Inventors: Zeljko Ignjatovic, Rochester, NY (US); Mark F. Bocko, Caledonia, NY (US)

(73) Assignee: University of Rochester, Rochester, NY (US)

( * ) Notice: Subject to any disclaimer, the term of this patent is extended or adjusted under 35 U.S.C. 154(b) by 0 days.

(21) Appl. No.: 10/238,890

(22) Filed: Sep. 11, 2002

(51) Int. Cl.[7] .................................................. H03M 3/00
(52) U.S. Cl. ....................................... 341/143; 341/155
(58) Field of Search ................................. 341/155, 143, 341/144

(56) References Cited

U.S. PATENT DOCUMENTS

| | | |
|---|---|---|
| 5,027,120 A | 6/1991 | Thurston |
| 5,179,380 A | 1/1993 | White |
| 6,621,436 B2 * | 9/2003 | Yamamoto .................. 341/143 |

* cited by examiner

*Primary Examiner*—Brian Young
(74) *Attorney, Agent, or Firm*—Blank Rome LLP (57) ABSTRACT

A delta to sigma modulator or analog to digital converter uses a mirrored integrator. (The mirrored integrator has a frequency response function that is a mirror image—about half the Nyquist frequency—of a conventional integrator thus giving infinite gain at the Nyquist frequency.) The input signal is modulated with a chopper signal alternating between +1 and −1. The chopped input signal is added to a feedback signal and applied to the mirrored integrator. It is then quantized and high-pass filtered. The frequency of the input signal is thus shifted from the low-frequency spectrum.

16 Claims, 6 Drawing Sheets

SIGMA-DELTA ANALOG TO DIGITAL CONVERTER ARCHITECTURE BASED UPON MODULATOR DESIGN EMPLOYING MIRRORED INTEGRATOR

FIELD OF THE INVENTION

The present invention relates generally to analog to digital converters, and more specifically, to a delta-sigma modulation analog to digital converter with increased resolution and stability.

DESCRIPTION OF RELATED ART

Two basic techniques for implementing an analog-to-digital converter (ADC) are the open-loop technique and the feedback technique. An open-loop converter generates a digital code directly upon application of an input voltage and is generally asynchronous in operation. A feedback converter generates a sequence of digital codes from an input signal, reconverts the digital codes to an analog signal and feeds back the analog signal.

Figure 1:
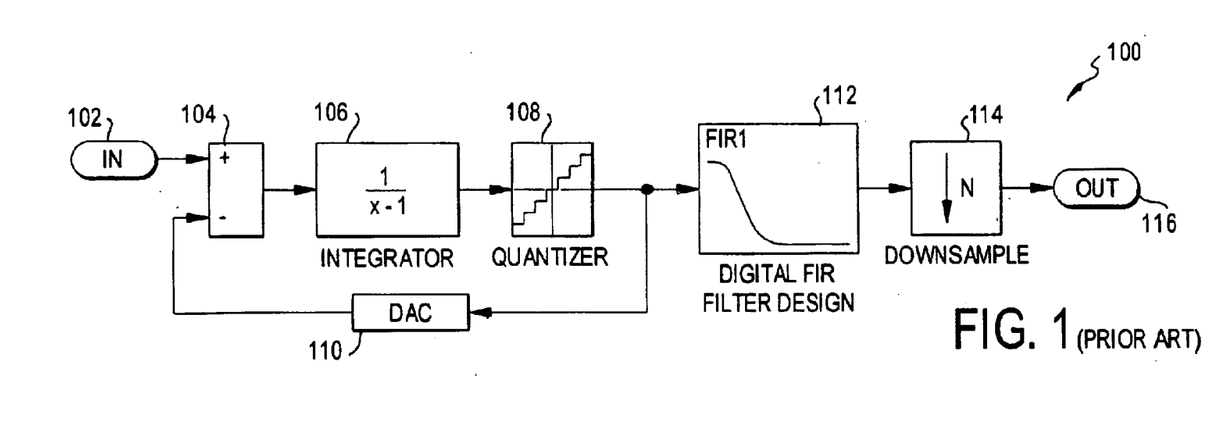
FIG. 1 shows a schematic diagram of a conventional first-order sigma-delta ADC architecture.

A typical first-order sigma-delta ADC is shown in FIG. 1 as 100. An analog signal received at an input 102 is applied to a subtracting circuit 104, where a feedback signal (to be described later) is subtracted from the analog signal received at the input. The resulting signal is integrated in an integrator, and the resulting integrated output is applied to a quantizer 108 to produce a digital number representing a level of the integrated output. The digital number output by the quantizer 108 is applied to a digital-to-analog converter (DAC) 110 to provide the feedback signal noted above. The digital number output by the quantizer 108 is also applied to a digital FIR filter 112, where it is low-pass-filtered, and to a downsampler 114, where it is downsampled. The resulting digital signal is output at an output 116.

Within the context of ADC's based on the sigma-delta architecture there are three basic approaches to increase the resolution: 1) Increase the oversampling ratio, 2) Increase the order of the modulator, 3) Increase the quantizer resolution. Those approaches have led to improvements of ADC resolution throughout the last decade; however, designs based upon those principles have been optimized, and further improvements will likely be modest. The prior art has concentrated mostly on employing band-pass filters in the modulator. However, a band-pass approach reduces the slope of the SNR increase versus modulator order by a factor of two. Therefore, such designs incur additional complication and concomitant performance penalties.

The following three U.S. patents are believed to be the most relevant to the subject matter of the present application.

U.S. Pat. No. 5,027,120, "Delta-sigma converter with bandpass filter for noise reduction"

Analogue signals are converted to digital data by use of a Sigma-Delta modulator including a pair of bandpass filters and a feedback loop including a digital to analogue converter. The tendency of such a circuit to instability is reduced or eliminated by making small variations in the phase of a clock controlling feedback pulses relative to a clock controlling data output pulses. As an alternative, corrections may be made to the feedback pulses by an additional feedback loop providing pulses for correcting the feedback pulses. That patent covers the idea of bandpass signal conversion technique and its instability reduction.

U.S. Pat. No. 5,179,380, "One-bit sigma-delta modulator with improved signal stability"

The one-bit sigma-delta modulator with improved signal stability disclosed includes, in order, a first anti-aliasing filter, a chopper, a second anti-aliasing filter, and a one-bit modulator. The chopper and one-bit modulator are driven by a clock generator. The chopper is introduced to provide a carrier upon which the signal may ride, thereby eliminating dc stability problems. The first anti-aliasing filter eliminates aliasing from the chopper, and the second anti-aliasing filter eliminates aliasing from the one-bit modulator. The second anti-aliasing filter may be eliminated if the frequency of the chopper is an exact integer submultiple of the sampling frequency of the one-bit modulator. This invention may drive a decimation filter, to provide a low cost analog-to-digital converter.

That patent covers the general idea of an input signal modulation in order to decrease instability problems caused by a DC offset. It specifically limits itself to a one-bit modulator and does not cover multi-bit sigma-delta modulators and their stability issues.

U.S. Pat. No. 5,442,353, "Bandpass sigma-delta analog-to-digital converter (ADC), method therefor, and receiver using same"

A bandpass sigma-delta analog-to-digital converter (ADC) (10) includes first (11) and second (12) band pass sigma-delta modulators, and a digital filter (13) connected to digital outputs thereof. In the illustrated embodiment, the first band pass sigma-delta modulator (11) is a second-order, single bit bandpass modulator, and the second bandpass sigma-delta modulator (12) is a first-order, multiple-bit modulator. Coefficients in feedback paths of the first (1) and second (12) modulators are derived from a transfer function of the digital filter. In one embodiment, a receiver (50) for a system such as frequency modulation (FM) radio converts an intermediate frequency (IF) analog signal to digital in-phase (I) and quaternary (Q) signals using the bandpass sigma-delta ADC (10). That patent covers only the idea of bandpass signal conversion technique, and its instability reduction.

U.S. Pat. No. 4,994,804 "Double integration delta-sigma modulation analog to digital converter"

The abstarct of that patent states "A delta-sigma modulation analog to digital converter for converting an analog input signal to a digital output signal. The converter includes an input circuit for receiving the analog input signal, a clock generator for generating a very high frequency clock signal with first and second phases, a first switching circuit coupled to the input circuit for modulating the analog input signal with the very high frequency clock signal, an integration circuit coupled to the first switching circuit for integrating the modulated input signal and generating a noise signal, a second switching circuit coupled to the integration circuit both for demodulating the integrated modulated input signal and modulating the noise signal with the very high frequency clock signal, a quantizing circuit coupled to the second switching circuit for responsive to the demodulated input signal and the modulated noise signal for generating the digital output signal including a separable portion corresponding to the modulated noise signal and a feedback circuit coupled between the quantizing circuit and the integration circuit both for generating a feedback signal corresponding to the digital output signal and feeding the feedback signal to the integration circuit."

That patent covers the idea of modulating an input signal with a very high frequency clock signal similar to the method of the present invention. However, the referenced patent employs a conventional integrator as the modulator filter which, by consequence, fails to achieve the favorable noise shaping properties of the present invention.

SUMMARY OF INVENTION

It will be apparent from the above that a need exists in the art to improve the resolution of the sigma-delta ADC without reducing performance or increasing complexity to the degree experienced in the prior art. It is therefore an object of the present invention to provide an architecture to do so.

To achieve the above and other objects, the present invention uses a "Mirrored Integrator" (MI) in the modulator. The modulator itself could be of the N-th order and it could employ an M-bit quantizer and M-bit Digital-to-analog converter (DAC). The new approach retains the low-pass sigma-delta slope of the SNR. In addition, the noise-shaping property of the sigma-delta converter employing a MI is that the quantization noise is shaped toward the low-frequency portion of the spectrum (in opposition to conventional Sigma-delta converters where the quantization noise is shaped toward the high-frequency portion of the spectrum). In the new approach, the output signal may be passed through a high-pass filter (in opposition to a conventional sigma-delta converter in which the signal is passed through a low-pass filter). After filtering, in order to shift the signal back to the low-frequency portion of the spectrum, the signal may be decimated by employing the procedure used in conventional Sigma-delta converters. In an ideal situation, where analog noise is flat over the spectrum, and where both the quantizer and DAC are ideal, there is no improvement offered by the new design. However, in practice, 1/f noise in the modulator is dominant at frequencies extending up to 500 kHz, and DAC non-linearity as well as nonlinearities introduced by the opamp and quantizer output limits are always evident in the lower portion of the spectrum regardless of the input signal frequency. Therefore, the noise-shaping property of the new architecture, in which the noise is "pushed" toward the low-frequency portion of the spectrum, which is already cluttered with the 1/f noise and DAC and/or quantizer harmonic distortion, and then filtered out by the high-pass filter affords an overall improvement in resolution over the conventional sigma delta ADC design.

An important aspect of the new approach is based upon shifting the input signal to the upper frequency range of the spectrum. In the new approach described here, the input signal is frequency-shifted into the upper-most part of the spectrum. Specifically, the frequency spectrum of the input signal is shifted up to near the Nyquist frequency (which is defined as one-half of the sampling frequency and which equals the bandwidth of the ADC).

It will be readily apparent that the modulator or converter according to the present invention can be, but is not necessarily, implemented in a single chip. Other implementations could be developed, such as discrete components, implementation in a programmable computing device through appropriate software, or optical computing.

BRIEF DESCRIPTION OF THE DRAWINGS

Preferred embodiments of the present invention will be set forth in detail with reference to the drawings, in which.

DETAILED DESCRIPTION OF THE PREFERRED EMBODIMENT

Preferred embodiment the present invention will be set forth in detail with reference to the drawings, in which like reference numerals refer to like elements throughout.

Figure 2A:
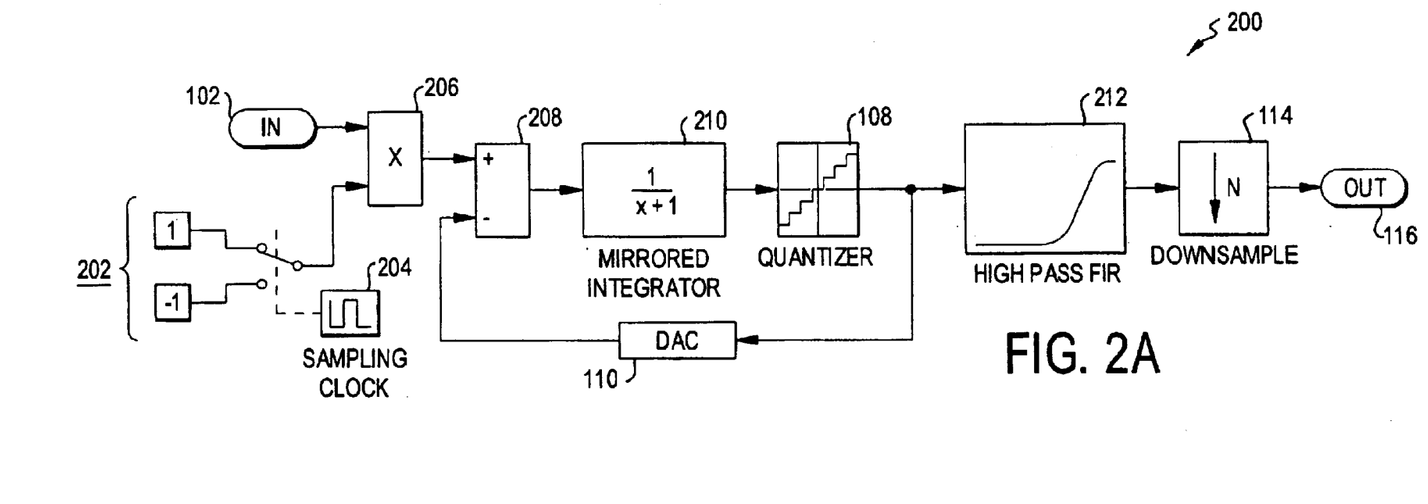
FIG. 2A shows a schematic diagram of a first-order sigma-delta ADC architecture according to a preferred embodiment.

A sigma-delta converter architecture according to a preferred embodiment is shown in FIG. 2A as 200. The input 102, quantizer 108, downsampler 114 and output 116 can be like those of the conventional architecture of FIG. 1.

However, in the architecture 200, a chopper signal generator 202, under control of a sampling clock 204, produces a chopper signal having a frequency that is one-half of the sampling frequency. The chopper signal is a square wave alternating between +1 and −1.

The input signal is modulated by the chopper signal in a multiplier 206 and is then added to the feedback signal from the DAC 110 in an adder 208. The resulting signal is applied to a mirrored integrator 210 and then quantized in a quantizer 108. Instead of a low-pass filter 112, a high-pass filter 212 is used.

It can be seen from FIG. 2A that the sign of every other sample of the input signal is alternated. This operation is equivalent to modulating the input signal by a square wave with a frequency of one-half of the sampling frequency. This operation shifts the frequency of the input signal from the low-frequency region of the spectrum up to near fs/2. where fs is the sampling frequency.

Figure 2B:
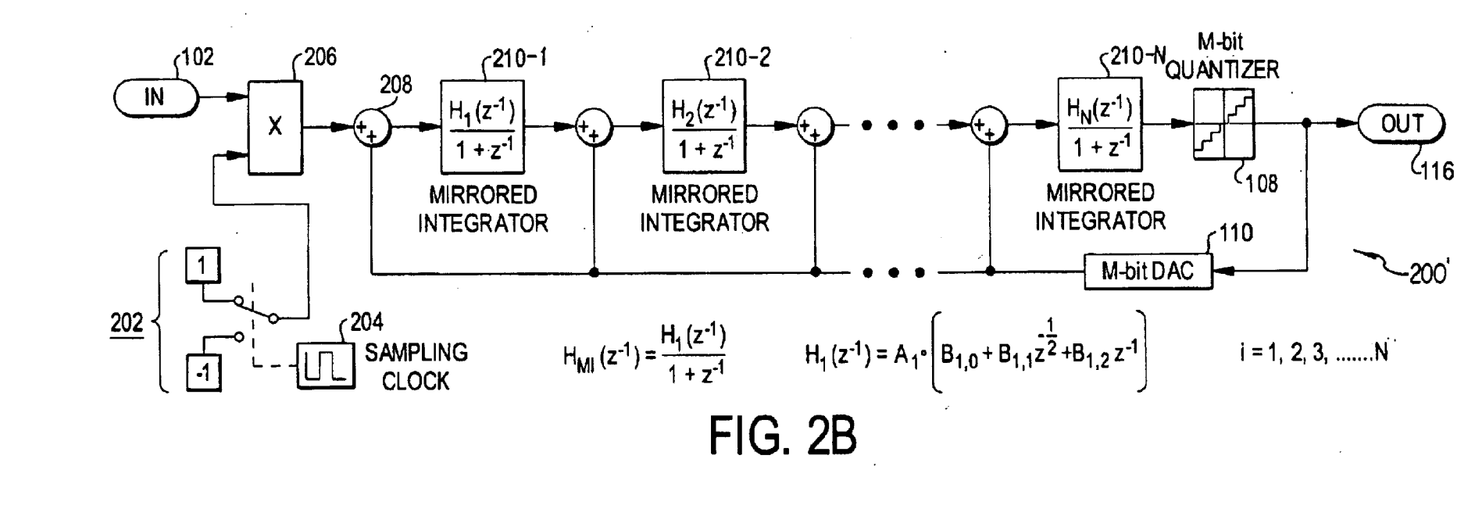
FIG. 2B shows a schematic diagram of a higher-order sigma-delta ADC architecture based on the first-order architecture of FIG. 2A.
Figure 2C:
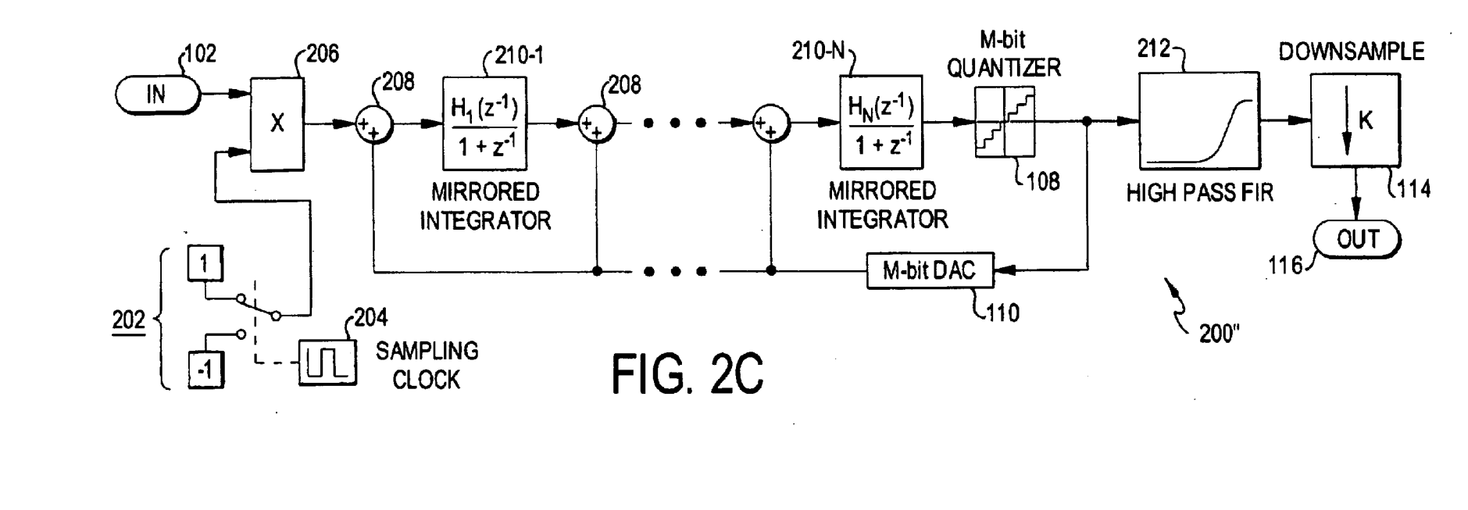
FIG. 2C shows a further modification of the architecture of FIGS. 2A and 2B.

In general, the modulator might be N-th order and employ an M-bit quantizer, where N and M are integers. Such an N-th order modulator is shown in FIG. 2B as 200' and has multiple mirrored integrators 210-1, 210-2, . . . , 210-N. The modulator may be further modified, as shown in FIG. 2C as 200". In that modulator, in order to shift the signal back to the low-frequency portion of the spectrum, the signal may be decimated by employing the procedure used in conventional sigma-delta converters.

Figure 3:
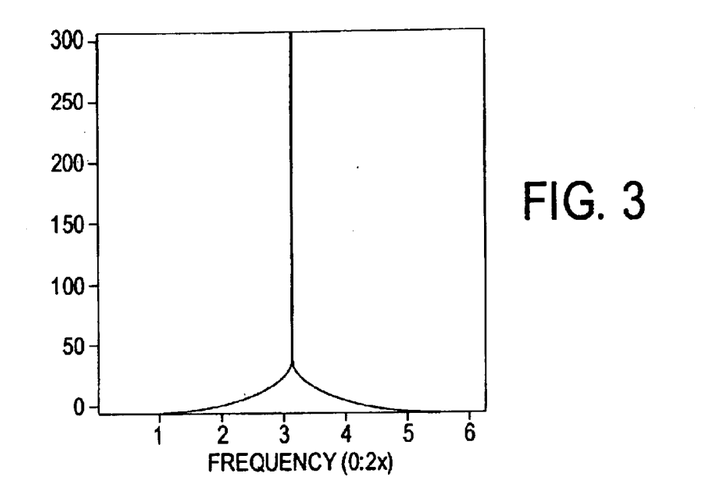
FIG. 3 shows the transfer function of the general mirrored integrator.

In contrast to the conventional sigma-delta modulator design in which the feedback signal is subtracted from the input, the feedback signal is added to the input signal. The mirrored integrator attenuates low frequency signals and amplifies high frequency signals. The transfer function of the general mirrored integrator is shown in FIG. 3, and it is given by Equation (1), $$H_{MI}(z^{-1}) = \frac{A \cdot \left(B_0 + B_1 z^{-\frac{1}{2}} + B_2 z^{-1}\right)}{1 + z^{-1}} \quad (1)$$

where $A$, $B_0$, $B_1$ and $B_2$ are constants.

In order to analyze the behavior of the MI sigma-delta converter, the quantizer is represented by a noise source $e[n]$, as is the usual practice in such analyses. We assume that a first order (N=1) MI sigma-delta converter is employed. The coefficients are assumed to be: $B_0=B_1=0$ and $A=B_2=1$. Then, the output signal $Y(z)$ from the MI modulator is equal to:

$$Y(z)=He(z)E(z)+z^{-1}X(z), \quad (2)$$

$$He(z)=(1+z^{-1}) \quad (3)$$

where $E(z)$ is the linear representation of the quantization noise, and $X(z)$ is the sign-alternated input signal. Thus, the sign-alternated input signal is only delayed. The quantization noise is shaped according to the transfer function $He(z)$.

Figure 4:
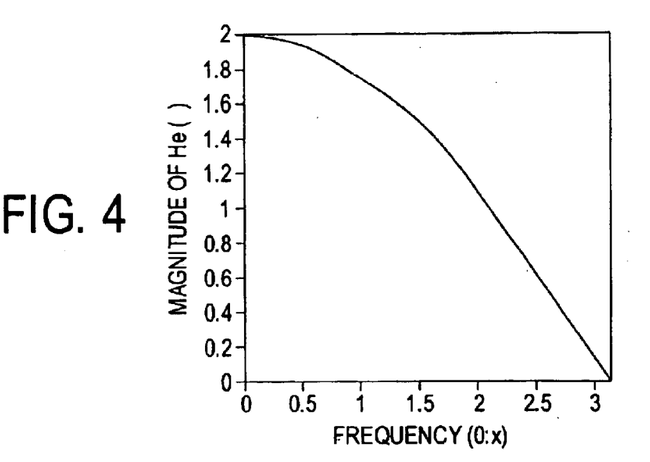
FIG. 4 shows the magnitude response of the transfer function.

The magnitude response of the transfer function of $He(z)$ is shown in FIG. 4. According to FIG. 4, the noise power will be pushed toward the low frequency portion of the spectrum. After high-pass filtering, the modulated input signal remains the same, but the excess noise, i.e., the noise in the lower frequency portion of the spectrum, is removed.

There is no need for output signal demodulation in order to return the signal to a low-frequency band. The down-sampler, which is intended to reduce the sample rate, displays a very interesting property when handling high-pass band-limited signals. If the input signal to the down-sampler is band-limited around fs/2 and if the down-sampling ratio is of an even order, the down-sampler generates a replica of the spectrum signal around DC. Thus, the resulting output signal is naturally shifted back to the low frequency portion of the spectrum.

The operational amplifier analog noise (thermal+1/f noise) can be modeled as purely additive noise at the input of the mirrored integrator's operational amplifier. Together with the input signal, the delayed version of the noise passes through the modulator. Since the output filter is high-pass, it filters out the low frequencies which contain only noise, and it passes the input signal that is near fs/2. Since the 1/f noise becomes dominant below approximately 500 kHz, the mirrored integrator structure will remove this noise energy. Thus the portion of the spectrum near fs/2 that contains the input signal is less corrupted than in conventional sigma delta ADC designs that employ an integrator in place of the mirrored integrator.

A major benefit of the new design is the reduced contribution of analog noise at low frequencies. As with the input opamp analog noise, the opamp DC offset can be considered to be additive to the input of the modulator. Thus, the modulator does not shape the DC offset and a dc component appears at the modulator output. However, this additive DC offset is far from the band of frequencies containing the signal power (around fs/2) and it is greatly attenuated by the following high-pass digital filter.

Another very important advantage of the new sigma-delta converter architecture is the shaping of the spurious signals that are generated by the DAC non-linearity. In single-bit quantizer designs, the one-bit DAC is inherently linear, so the new design offers no advantage in this regard. However, it has been shown that the DAC non-linearity limits the SNDR (Signal to Noise+Distortion Ratio) in the cases where a multibit quantizer is employed. An increase of the quantizer resolution lowers the quantization noise floor. At the same time, the harmonic distortion caused by the DAC non-linearity becomes more visible above the noise floor, and may become the dominant limiting factor of the dynamic range.

Figure 5A:
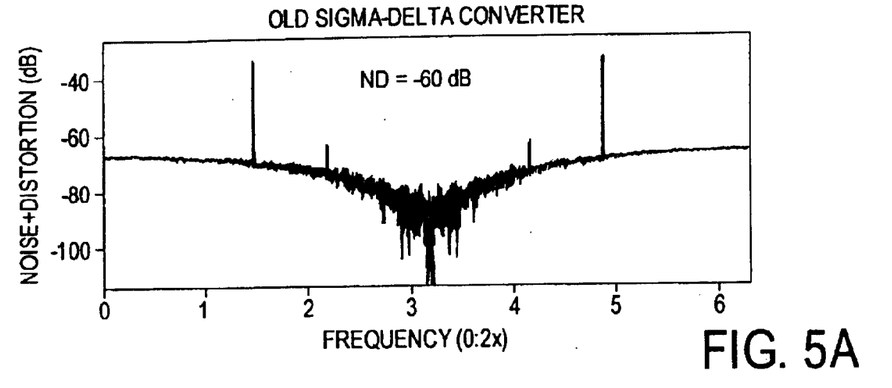
FIGS. 5A, 5B, 6, 7A, 7B, 8 and 9 show simulation results.
Figure 5B:
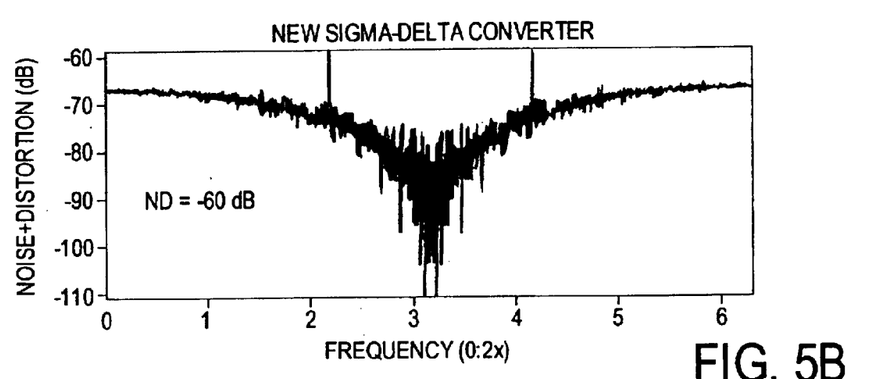

Simulation has shown that if the DAC polynomial expansion of the DAC's non-linearity has even order terms, the harmonic distortion is suppressed in the new sigma-delta architecture relative to the conventional architecture. For example, assuming the DAC non-linear transfer function is represented as:

$$y[n]=x[n]+ax^2[n]+bx^3[n], \quad (4)$$

where the coefficients are chosen as follows: a=0.01, b=0.001 and the input signal is −6 dB, then the new Sigma-delta design shows a SNDR improvement of 9 dB. The simulation result is shown in FIGS. 5A and 5B.

On the other hand, if the DAC non-linearity has only odd power terms, there is no improvement. In other words, the old and the new design have the same vulnerability to such DAC non-linearity. However, it is highly unlikely that the DAC non-linearity is only of odd order. Thus, the improvement is evident if any even order nonlinearities are present. This improvement arises from the fact that the even order terms in the polynomial expansion of the non-linearity produce harmonic distortion with energy in the lower portion of the spectrum (near DC). Thus, the ability of the new architecture to attenuate low frequencies leads to a net reduction of the distortion caused by the DAC non-linearity.

Figure 6:
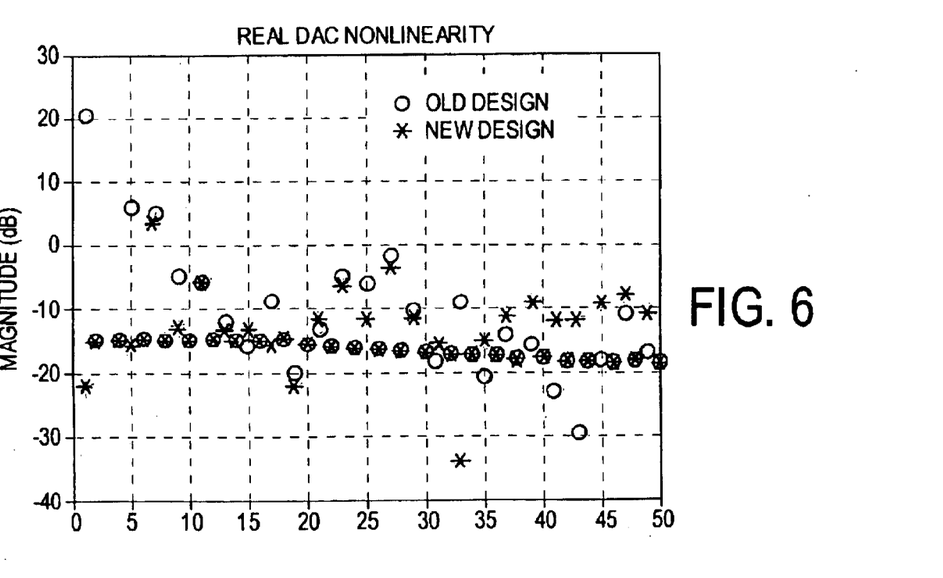

The simulation results shown in FIG. 6 show the improvement afforded by the new architecture, where the real DAC integral linearity error versus code has been used in the simulation in the form of the look-up table.

In the new architecture, the largest harmonic components due to the DAC nonlinearity are 15 dB below those of the conventional architecture. This improvement can be explained as follows.

If the DAC nonlinearity has even symmetry, the resulting distortion would have more energy near DC. However, the odd symmetry components lead to distortion components in the signal bandwidth near fs/2. The distortion arising from the DAC nonlinearity may be treated as an additive signal at the input of the modulator and, as was the case for 1/f noise and dc offsets, the modulator doesn't affect that signal. The following high-pass digital filter would attenuate distortion from the even symmetry nonlinearities, and it does not affect the distortion caused by odd symmetry DAC nonlinearities. In contrast, the traditional ADC architecture would not attenuate the non-linear distortion at all, passing both the even and odd symmetry related components.

Figure 7A:
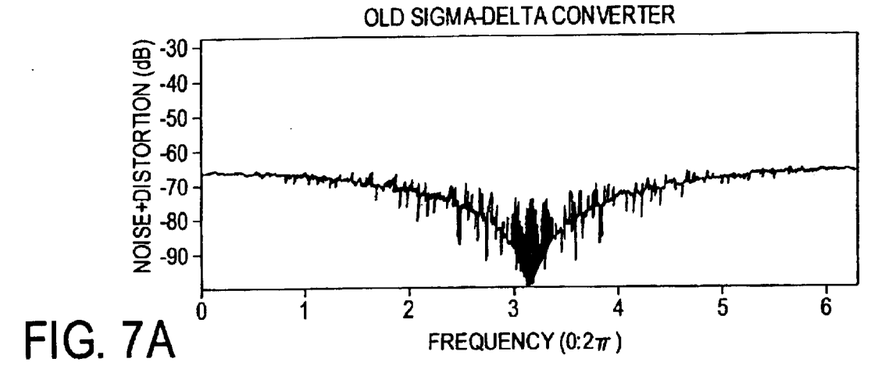
Figure 7B:
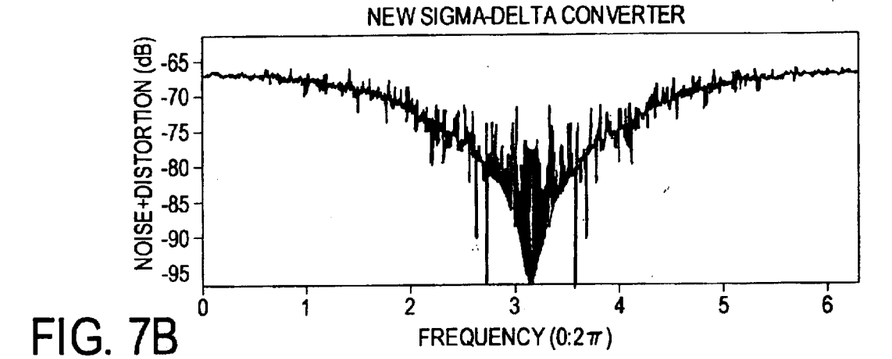

The new Sigma-delta design also demonstrates improved attenuation of the DAC's DC offset. If the same input signal as above is assumed, and if the DAC has 1 LSB DC offset then the distortion at 0 Hz is about 32 dB smaller in the new design than in the old one (FIGS. 7A and 7B). The overall noise+distortion power is 3 dB less in the new design.

In reality, the integrator and mirrored integrator do not have an unlimited output voltage swing. In certain instances, the output voltage can saturate at either the maximum or minimum value. This event is called clipping. Clipping leads to non-linear behavior of the modulator. As a result, the output voltage would contain harmonics of the signal frequency that would decrease the SNDR (Signal-to-Noise+Distortion Ratio). This nonlinearity may also lead to instability.

Figure 8:
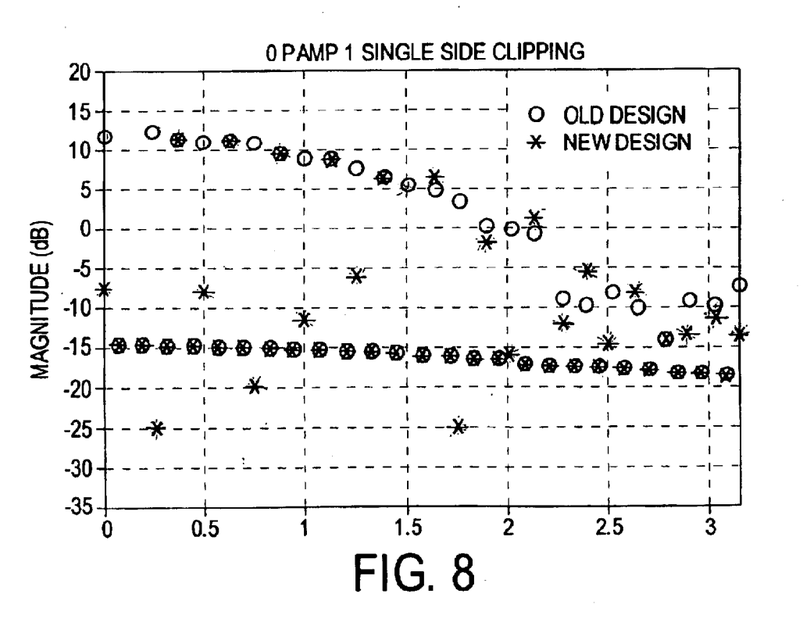

The simulations have shown that the new architecture does not show any improvement when the clipping occurs at both the positive and negative sides simultaneously. But this situation is highly unlikely. The more likely situation would be single sided clipping (where the clipping occurs only at either the positive or negative rail). In such a case, the new architecture performs better than the conventional architecture. In simulations with a first order modulator, OSR equal to 4, an 8-bit quantizer, and with an 8-th order FIR, when 1% single side clipping occurs, i.e., the limit of the output voltage for one polarity is 1% below the maximum expected ideal voltage value, (where the percentage is related to the maximum output voltage span), the new architecture attenuates the DC distortion and even order harmonics by an average of 20 dB and it does not change the odd harmonics. We also add that, with the same conditions as above, the new architecture attenuates DC and the even harmonics around the input signal by a large factor (around 25 dB). This improvement is shown in FIG. 8.

Figure 9:
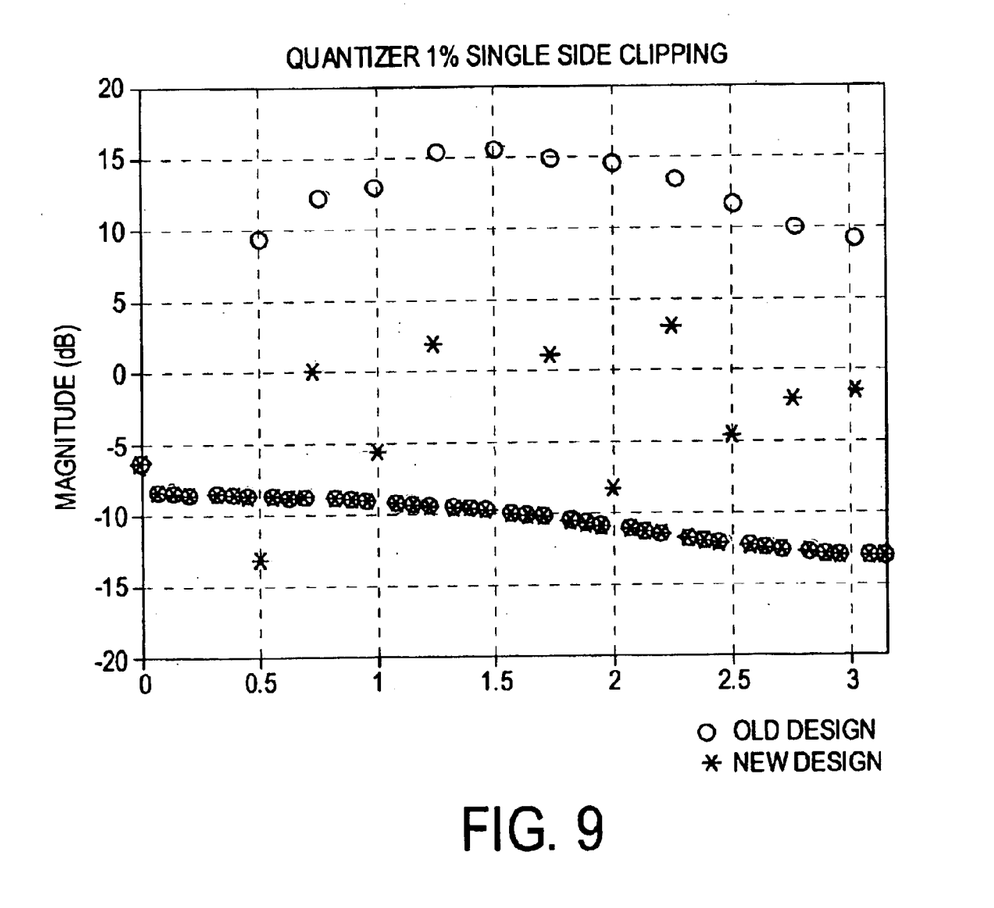

As with the integrator/mirrored integrator clipping, quantizer clipping might also occur thus giving rise to nonlinear distortion. As in the previous case, when symmetric clipping at both rails occurs, there is no improvement. Again, this is a highly unlikely situation. In the more likely situation in which clipping first appears for one polarity of the signal, simulations have shown that the new architecture is again superior to the conventional architecture. The new architecture attenuates both the even and odd order harmonics (FIG. 9).

In the simulations the following assumptions were made: a first order modulator, an OSR of 4, an 8-bit quantizer, and the 8-th order FIR. When 1% single side clipping occurs, the new architecture attenuates even harmonics by an average of 19.5 dB and odd harmonics by average of 12 dB compared to the conventional architecture. It is reasonable to conclude that the new architecture will perform even better if the order of the modulator is increased. Furthermore we conclude that the new architecture will display improved stability in comparison to the conventional sigma delta ADC architecture.

Figure 10A:
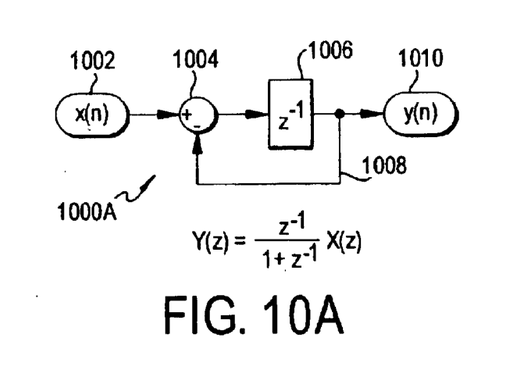
FIGS. 10A and 10B show block diagrams of two implementations of a mirrored integrator.
Figure 10B:
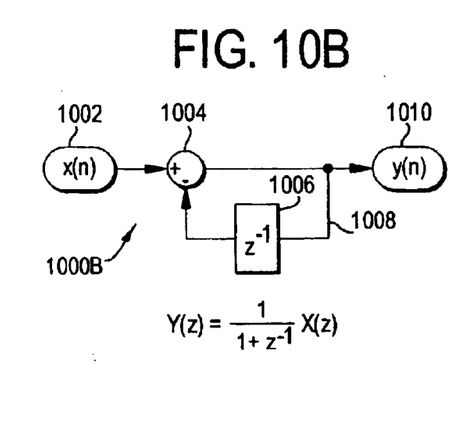

The implementation of the mirrored integrator will now be disclosed. Block diagrams of two implementations are shown in FIGS. 10A and 10B as 1000A and 1000B respectively. In both of the mirrored integrators, an input x[n] is received at an input 1002 and applied to a subtractor 1004 and thence to a circuit which includes an inverter 1006 and a feedback loop 1008. The resulting signal y[n] is output at an output 1010.

The two integrators differ in whether the inverter is located in the feedback loop or in the other arm of the circuit, which in turn affects the output as a function of the input. The mirrored integrator 1000A of FIG. 10A outputs an output $$Y(z) = \frac{z^{-1}}{1+z^{-1}} X(z),$$

while the mirrored integrator 1000B of FIG. 10B outputs an output $$Y(z) = \frac{1}{1+z^{-1}} X(z).$$

While a preferred embodiment of the present invention and various modifications thereof have been set forth above, those skilled in the art who have reviewed the present disclosure will readily appreciate that other embodiments can be realized within the scope of the invention. For example, teachings of numerical values are illustrative rather than limiting, as are teachings of specific circuit elements. Also, as noted above, a modulator or converter as recited in the claims could be implemented in any of several ways, including a single chip, discrete elements, a programmed computing device, or optical computing. Therefore, the present invention should be construed as limited only by the appended claims.

What is claimed is:

1. A delta-sigma modulator for converting an analog input signal to a digital output signal, the modulator comprising:
an input for receiving the analog input signal;
a clock generator for generating a sampling clock signal at a sampling frequency and for generating a chopper signal which has a frequency of one-half the sampling frequency;
an input signal switching circuit, coupled to the input and the clock generator, for modulating the analog input signal with the chopper signal to output a modulated input signal;
an N-th order mirrored integration circuit, coupled to an output of the input signal switching circuit, for mirrored integrating the modulated input signal to output a mirrored integrated signal, wherein N is a positive integer;
an M-bit quantizer, coupled to the N-th order mirrored integration circuit, for generating an M-bit digital output number from the mirrored integrated signal, wherein M is a positive integer; and
a feedback circuit, coupled between the quantizer and the mirrored integration circuit, for converting the M-bit digital output number into a feedback signal and for feeding the feedback signal back to the mirrored integration circuit.

2. The delta-sigma modulator according to claim 1, further comprising a digital high-pass filter, connected to the M-bit quantizer, for high pass filtering the M-bit digital output number to produce a filtered digital output.

3. The delta-sigma modulator according to claim 2, further comprising a down-sampling circuit, connected to the digital high-pass filter, for data rate reduction of the filtered digital output.

4. The delta-sigma modulator according to claim 1, wherein the chopper signal alternates between values of +1 and −1.

5. The delta-sigma modulator according to claim 1, wherein N≧2.

6. The delta-sigma modulator according to claim 5, wherein the N-th order mirrored integration circuit comprises N mirrored integrators in series, and wherein the feedback circuit feeds the analog feedback signal back to each of the N mirrored integrators.

7. The delta-sigma modulator according to claim 6, wherein the analog feedback signal is added to an input of each of the N mirrored integrators.

8. The delta-sigma modulator according to claim 1, wherein the analog feedback signal is added to an input of the N-th order mirrored integration circuit.

9. A delta-sigma modulator for converting an analog input signal to a digital output signal, the modulator comprising:
an input for receiving the analog input signal;
a clock generator for generating a clock signal at a sampling frequency;
an N-th order mirrored integration circuit, having a first input for receiving the analog input signal and a second input for receiving a reference signal, for mirrored integrating the input signal under control of the clock signal to output a mirrored integrated signal, wherein N is a positive integer;
an M-bit quantizer, coupled to the N-th order mirrored integration circuit, for generating an M-bit digital output number from the mirrored integrated signal, wherein M is a positive integer; and
a feedback circuit, coupled between the quantizer and the second input of the mirrored integration circuit, for producing a feedback signal in accordance with the M-bit digital output number and for feeding the feedback signal to the second input of the mirrored integration circuit as the reference signal.

10. The delta-sigma modulator according to claim 9, wherein M=1 and the M-bit digital output number is a one-bit digital output number.

11. The delta-sigma modulator according to claim 10, wherein the feedback circuit comprises an inverter for inverting the one-bit digital output number.

12. A delta-sigma modulation analog to digital converter for converting an analog input signal to a digital output signal, the modulator comprising:

an input for receiving the analog input signal;

a clock generator for generating a sampling clock signal at a sampling frequency and for generating a chopper signal which has a frequency of one-half the sampling frequency;

an input signal switching circuit, coupled to the input and the clock generator, for modulating the analog input signal with the chopper signal to output a modulated input signal;

an N-th order mirrored integration circuit, coupled to an output of the input signal switching circuit, for mirrored integrating the modulated input signal to output a mirrored integrated signal, wherein N is a positive integer;

an M-bit quantizer, coupled to the N-th order mirrored integration circuit, for generating an M-bit digital output number from the mirrored integrated signal, wherein M is a positive integer; and a feedback circuit, coupled between the quantizer and the mirrored integration circuit and comprising an M-bit digital-to-analog converter, for converting the M-bit digital output number into an analog feedback signal and for feeding the analog feedback signal back to the mirrored integration circuit;

a digital high-pass filter, connected to the M-bit quantizer, for high pass filtering the M-bit digital output number to produce a filtered digital output; and a down-sampling circuit, connected to the digital high-pass filter, for data rate reduction of the filtered digital output.

13. A delta-sigma modulator for converting an analog input signal to a digital output signal, the modulator comprising:

an input for receiving the analog input signal;

an alternate input source for deriving an alternate input signal in accordance with the analog input signal and for alternately passing the analog input signal and the alternate input signal to produce a modulated input signal;

an N-th order mirrored integration circuit, coupled to an output of the input signal switching circuit, for mirrored integrating the modulated input signal to output a mirrored integrated signal, wherein N is a positive integer;

an M-bit quantizer, coupled to the N-th order mirrored integration circuit, for generating an M-bit digital output number from the mirrored integrated signal, wherein M is a positive integer; and a feedback circuit, coupled between the quantizer and the mirrored integration circuit, for converting the M-bit digital output number into a feedback signal and for feeding the feedback signal back to the mirrored integration circuit.

14. The modulator according to claim 13, wherein the alternate input source comprises a circuit for inverting the analog input signal.

15. The modulator according to claim 13, wherein the alternate input source is connected to the feedback circuit to receive the feedback signal, and wherein the feedback signal is the alternate input signal.

16. The modulator according to claim 15, wherein the feedback circuit comprises an inverter.

* * * * *